(12) United States Patent
Gotou

(10) Patent No.: US 10,921,384 B2
(45) Date of Patent: Feb. 16, 2021

(54) DISCONNECTION SENSING CIRCUIT AND ELECTRICAL CONNECTION BOX

(71) Applicant: Sumitomo Wiring Systems, Ltd., Mie (JP)

(72) Inventor: Takuma Gotou, Mie (JP)

(73) Assignee: Sumitomo Wiring Systems, Ltd., Mie (JP)

(*) Notice: Subject to any disclaimer, the term of this patent is extended or adjusted under 35 U.S.C. 154(b) by 0 days.

(21) Appl. No.: 16/094,065

(22) PCT Filed: Mar. 30, 2017

(86) PCT No.: PCT/JP2017/013148
§ 371 (c)(1),
(2) Date: Oct. 16, 2018

(87) PCT Pub. No.: WO2017/183406
PCT Pub. Date: Oct. 26, 2017

(65) Prior Publication Data
US 2019/0113559 A1   Apr. 18, 2019

(30) Foreign Application Priority Data

Apr. 20, 2016 (JP) .............................. JP2016-084260

(51) Int. Cl.
*G01R 31/02* (2006.01)
*G01R 31/50* (2020.01)
(Continued)

(52) U.S. Cl.
CPC .............. *G01R 31/50* (2020.01); *B60R 16/02* (2013.01); *G01R 31/005* (2013.01)

(58) Field of Classification Search
None
See application file for complete search history.

(56) References Cited

U.S. PATENT DOCUMENTS

| 9,621,024 | B2* | 4/2017 | Endo | ...................... H02M 1/32 |
| 2005/0151559 | A1* | 7/2005 | Liao | ...................... G01R 31/50 |
| | | | | 307/64 |

(Continued)

FOREIGN PATENT DOCUMENTS

| JP | 2002199577 A | 7/2002 |
| JP | 2014163851 A | 9/2014 |

(Continued)

OTHER PUBLICATIONS

International Search Report for Application No. PCT/JP2017/013148 dated Jun. 27, 2017.

*Primary Examiner* — Jas A Sanghera
(74) *Attorney, Agent, or Firm* — Honigman LLP

(57) ABSTRACT

The disconnection sensing circuit is provided with: the control unit having the ground connection terminal and the input terminal; the first external connection terminal capable of being connected to an external ground, the first external connection terminal being connected to the control-side ground line as a conduction path connected to the ground connection terminal; the second external connection terminal capable of being connected to an external ground, the second external connection terminal being connected to the power-side ground line as a conduction path having a greater electrifying current than the control-side ground line; and the transistor that restricts the electric power direction of the first bypass line connected between the control-side ground line and the power-side ground line to one direction, and that outputs the sensing signal corresponding to the electric power flowing through the first bypass line to the input terminal.

7 Claims, 4 Drawing Sheets

(51) Int. Cl.
*B60R 16/02* (2006.01)
*G01R 31/00* (2006.01)

(56) References Cited

U.S. PATENT DOCUMENTS

2010/0271054 A1 10/2010 Nagasawa
2016/0164318 A1 6/2016 Sekizaki et al.

FOREIGN PATENT DOCUMENTS

JP 2015121418 A 7/2015
JP 2015136078 A 7/2015

* cited by examiner

FIG. 3

| GROUND | Tr | IN |
|---|---|---|
| CONNECT | OFF | H |
| OPEN | ON | L |

DISCONNECTION SENSING CIRCUIT AND ELECTRICAL CONNECTION BOX

CROSS-REFERENCE TO RELATED APPLICATIONS

This application is the U.S. national stage of PCT/JP2017/013148 filed Mar. 30, 2017, which claims priority of Japanese Patent Application No. JP 2016-084260 filed Apr. 20, 2016.

TECHNICAL FIELD

The technique disclosed in the present specification relates to a disconnection sensing circuit and an electrical connection box.

BACKGROUND

Electrical connection boxes housing electrical circuits have often been mounted in vehicles such as automobiles. One such electrical connection box is known in which the box includes a plurality of ground terminals connected to an external ground (a body earth or the like).

An electromagnetic load control apparatus disclosed in JP 2015-136078A includes a power ground terminal connected to a solenoid-side power ground line, and a logic ground terminal connected to a control circuit-side logic ground line. The power ground terminal and the logic ground terminal are connected by a bidirectional ESD diode. Voltage shifts are connected to the power ground line and the logic ground line, respectively. A disconnection on the power ground side can be detected by using a switch to switch between a line traversing the voltage shift and a line not traversing the voltage shift, and then checking respective comparator outputs.

JP 2015-136078A thus uses a configuration in which a disconnection is detected by using a switch to switch between a line traversing the voltage shift and a line not traversing the voltage shift, and then checking comparator outputs. As such, there is a problem in that components such as a switch for switching voltage shifts, a comparator, and so on are required, which complicates the configuration for sensing disconnects.

Having been conceived on the basis of such circumstances, an object of the technique disclosed in the present specification is to simplify a configuration for sensing disconnections.

SUMMARY

A disconnection sensing circuit according to the present specification includes: a control unit having a ground connection terminal and an input terminal; a first external connection terminal capable of being connected to an external ground, the first external connection terminal being connected to a control-side ground line as a conduction path connected to the ground connection terminal; a second external connection terminal capable of being connected to an external ground, the second external connection terminal being connected to a power-side ground line as a conduction path having a greater electrifying current than the control-side ground line; and a transistor that restricts an electric power direction of a first bypass line connected between the control-side ground line and the power-side ground line to one direction, and that outputs a sensing signal corresponding to electric power flowing through the first bypass line to the input terminal.

When the first external connection terminal or the second external connection terminal is not connected to the external ground due to a disconnection, an inter-terminal connection problem, or the like, the control-side ground line or the power-side ground line is open to a ground. According to this configuration, the electric power direction of electric power flowing in the first bypass line connecting the control-side ground line to the power-side ground line is restricted to one direction. As such, grounding can be achieved by using another ground line different from the ground line that is in an open state. Additionally, when electric power flows in the first bypass line, the sensing signal based on the electric power is output to the input terminal of the control unit from the transistor. Accordingly, the control unit can sense a disconnection or the like on the basis of the sensing signal input from the input terminal. This makes it possible to sense a disconnection without switching among circuits or the like, for example, which in turn makes it possible to simplify the circuit configuration.

The following aspects are preferably as embodiments of the technique disclosed in the present specification.

The control-side ground line and the power-side ground line are connected by a second bypass line provided parallel with the first bypass line, and a diode that sends electric power in the same direction as the electric power direction of the first bypass line but restricts electric power in the opposite direction is connected to the second bypass line between the control-side ground line and the power-side ground line.

This electrifies not only the transistor in the first bypass line, but also the diode in the second bypass line, which makes it possible to increase the electric power sent between the control-side ground line and the power-side ground line as compared to a configuration that does not include the second bypass line.

The transistor permits electric power in a direction from the control-side ground line toward the power-side ground line, and restricts electric power in the opposite direction.

Compared to the power-side ground line, it is difficult to sense disconnections in the path connected to the control-side ground line. However, according to this configuration, disconnections can be sensed in the path connected to the control-side ground line, where it is difficult to sense such disconnections.

An electrical connection box includes the disconnection sensing circuit and a case housing the disconnection sensing circuit.

Advantageous Effects of Invention

According to the technique disclosed in the present specification, a configuration for sensing a disconnection can be simplified.

BRIEF DESCRIPTION OF DRAWINGS

FIG. 3 is a diagram illustrating a correspondence relationship between transistor states before and after disconnection and an input signal of an input terminal.

DETAILED DESCRIPTION OF PREFERRED EMBODIMENTS

First Embodiment

Figure 1:
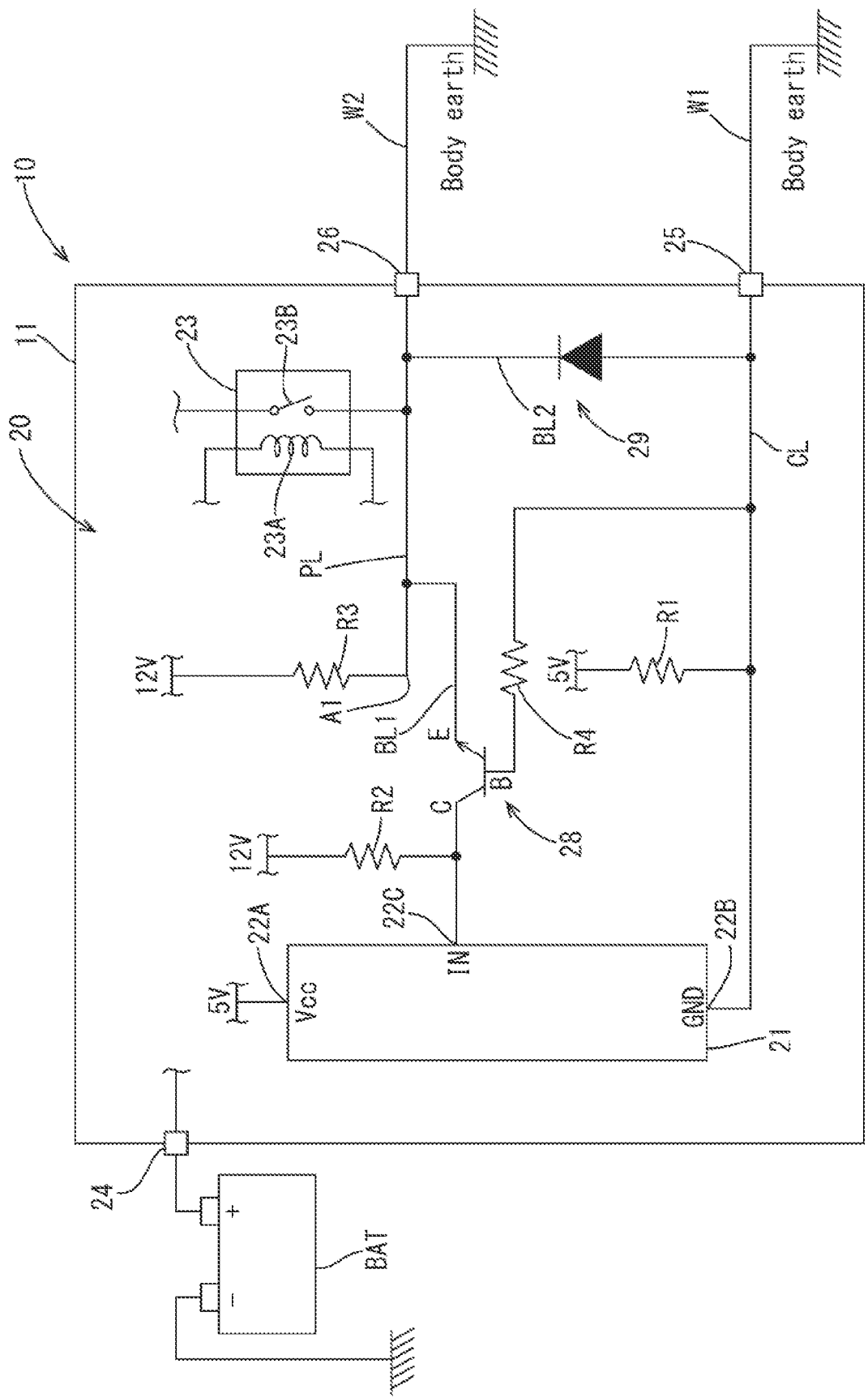
FIG. 1 is a diagram illustrating the electrical configuration of a disconnection sensing circuit according to a first embodiment.

A first embodiment will be described hereinafter with reference to FIGS. 1 to 4.

An electrical connection box 10 can be applied, for example, in an ECU (Electronic Control Unit), which is mounted in a vehicle such as an automobile, is connected between a power source BAT such as a battery and a ground (e.g., a body earth), and controls the supply/cutoff of power to a load such as a lamp or a motor.

The electrical connection box 10 includes a disconnection sensing circuit 20 and a case 11 that houses the disconnection sensing circuit 20. The disconnection sensing circuit 20 is constituted by a plurality of electrical components mounted on a circuit board, which is not shown, and includes: a control unit 21; a plurality of resistors R1 to R4; an electromagnetic switch 23 having a coil 23A and a contact part 23B; an external power source terminal 24 connectable to an external power source BAT; a first external connection terminal 25 and a second external connection terminal 26 connectable to external grounds; a control-side ground line CL, which is a conduction path connectable to the first external connection terminal 25; and a power-side ground line PL, which is a conduction path connectable to a second external connection terminal 26.

The control unit 21 is constituted by a microcomputer, for example, and includes: a power source connection terminal 22A into which a 5 V power source, for example, is input; a ground connection terminal 22B connectable to the control-side ground line CL; and an input terminal 22C into which is input a sensing signal indicating whether or not a disconnection has occurred. The input terminal 22C is connected, through the resistor R2, to a 12 V power source line continuing from the power source BAT.

In the electromagnetic switch 23, the contact part 23B turns on and off in response to the coil 23A electrifying. An upstream side of the contact part 23B is connected to the power source BAT through electrical equipment having a comparatively high electrifying current (e.g., a lamp or the like), and a downstream side is connected to the power-side ground line PL.

The first external connection terminal 25 is connected to an external ground through, for example, a wire W1, which is a conduction path. The second external connection terminal 26 is connected to an external ground through, for example, a wire W2, which is a conduction path. The wire W2 (conduction path) uses a thicker wire having a higher electrifying current capacitance value than the wire W1 (conduction path). The control-side ground line CL is a conduction path connecting the first external connection terminal 25 with the ground connection terminal 22B, and is connected to one end of the resistor R1. The other end of the resistor R1 is connected to a 5 V power source line, for example.

The power-side ground line PL (between point Al and the second external connection terminal 26 in FIG. 1) is a conduction path having a higher electrifying current than the control-side ground line CL, with one end connected to the second external connection terminal 26, and the other end connected to the resistor R3, the contact part 23B of the electromagnetic switch 23, and so on. The upstream side of the resistor R3 is connected to a 12 V power source line. A conduction path having an electrifying current capacitance value higher than that of the control-side ground line CL is used for the power-side ground line PL.

The control-side ground line CL and the power-side ground line PL are connected by a first bypass line BL1 and a second bypass line BL2, which are conduction paths parallel to each other. A diode 29 is connected to the second bypass line BL2 in series. The anode of the diode 29 is connected to the control-side ground line CL, and the cathode is connected to the power-side ground line PL. Due to the diode 29, the second bypass line BL2 is electrified in the direction from the control-side ground line CL toward the power-side ground line PL (direction D1 in FIG. 2), and electrification in the opposite direction is restricted.

Figure 4:
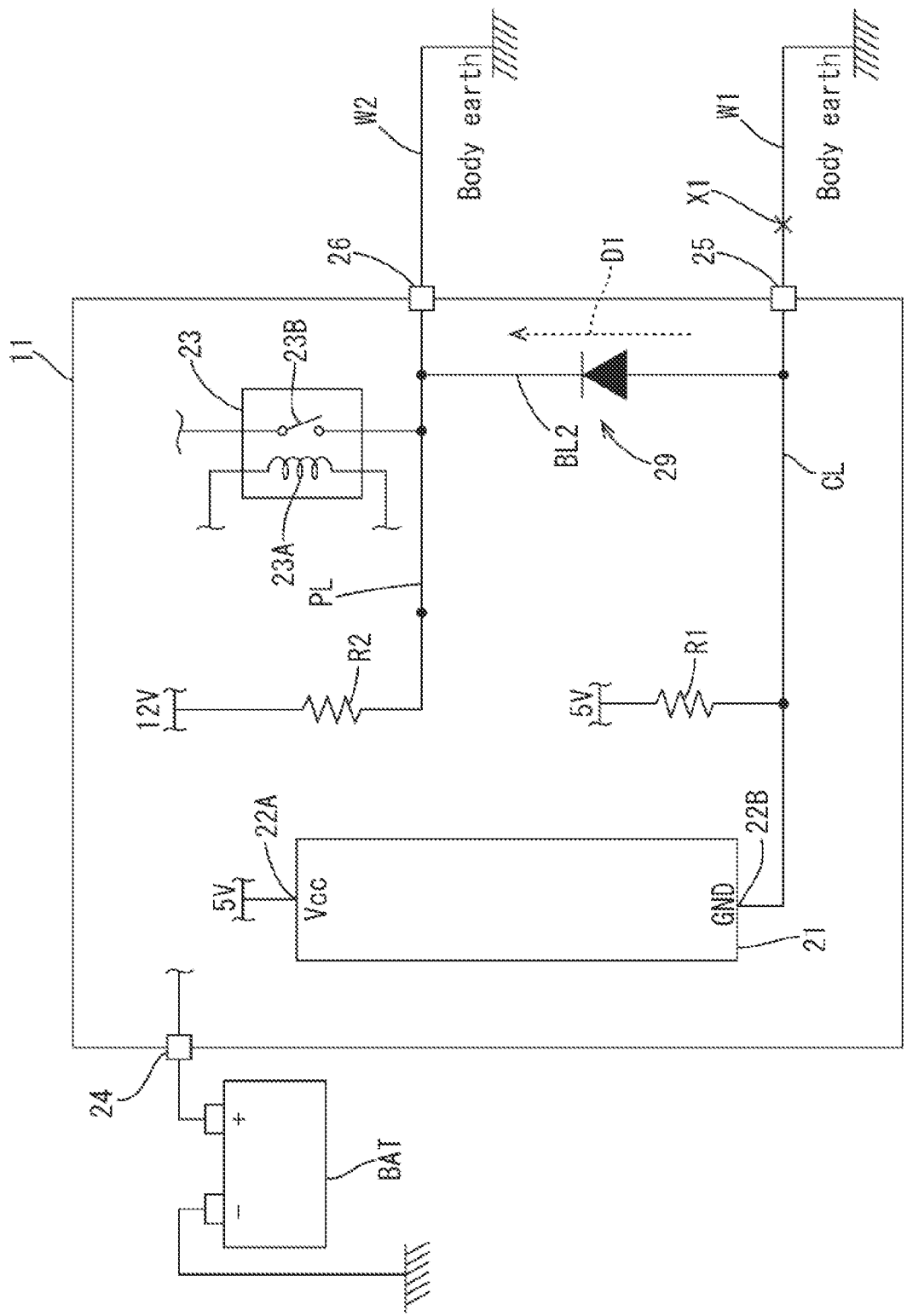
FIG. 4 is a diagram illustrating an electrical configuration according to a comparative example.

Consider the comparative example illustrated in FIG. 4, corresponding to a configuration in which the disconnection sensing circuit includes neither the first bypass line BL1 nor a transistor 28. Here, the control-side ground line CL can be connected to a ground potential through the second bypass line BL2 using the diode 29. However, the control unit 21 cannot sense a disconnection. As opposed to this, in the embodiment of the present application, the resistor R4 and the transistor 28 are connected in series to the first bypass line BL1 of the disconnection sensing circuit 20, as illustrated in FIG. 1.

The transistor 28 is, for example, an NPN junction bipolar transistor, the base of which is connected to the control-side ground line CL through the resistor R4 and the emitter of which is connected to the power-side ground line PL. The collector is connected to the input terminal 22C of the control unit 21. Due to the transistor 28, the first bypass line BL1 is electrified in the direction from the control-side ground line CL toward the power-side ground line PL, and electrification in the opposite direction is restricted. When the base of the transistor 28 is electrified, the path between the collector and emitter is electrified, and the voltage at the input terminal 22C goes to low level in accordance with the potential at the power-side ground line PL. Accordingly, the control unit 21 senses whether or not a disconnection has occurred on the basis of the signal input to the input terminal 22C.

Operations of the disconnection sensing circuit 20 will be described next.

Normally, the control-side ground line CL and the power-side ground line PL are both connected to the first external connection terminal 25 and the second external connection terminal 26 without disconnection ("CONNECT" in FIG. 3), and the transistor 28 is off at this time. The input terminal 22C of the control unit 21 is connected to the power source line through the resistor R2, and is therefore at high level.

Figure 2:
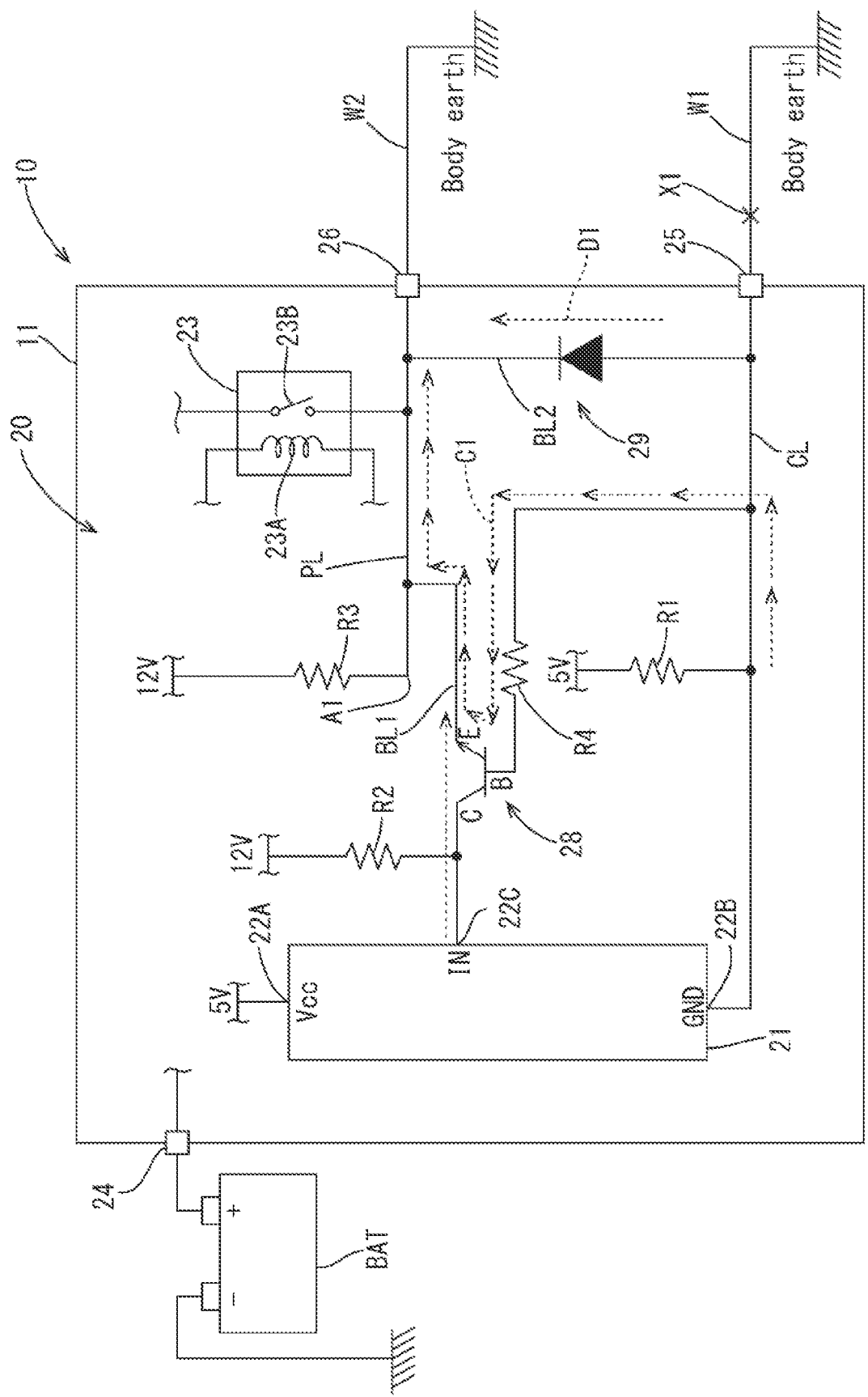
FIG. 2 is a diagram illustrating the flow of current when a disconnection occurs.
Figure 3:
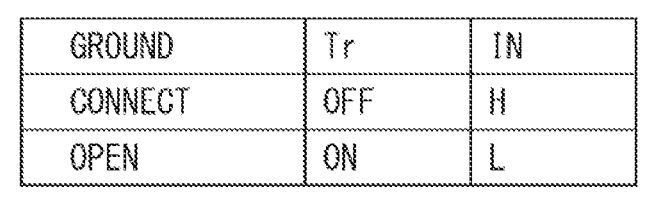

On the other hand, if a disconnection X1 (FIG. 2), an inter-terminal connection problem, or the like arises in the external wire W1 electrically connected to the control-side ground line CL, the control-side ground line CL will be open to the ground. In this case, the base potential of the transistor 28 will rise and the transistor 28 will turn on (FIG. 3), and the first bypass line BL1 will be electrified in the direction of C1, as illustrated in FIG. 2. The path between the collector and emitter is electrified at this time. As such, a low-level sensing signal based on the potential at the power-side ground line PL is input to the input terminal 22C, and the control unit 21 senses that a disconnection or the like has occurred in the first bypass line BL1. The control unit 21 may communicate information of the disconnection in the path of the control-side ground line CL, information of the inter-terminal connection problem (information indicating the open state to the ground), and so on to a user by displaying the result of sensing the disconnection in a display device (not shown), for example.

According to the present embodiment, the following actions and effects are achieved.

The disconnection sensing circuit 20 is provided with: the control unit 21 having the ground connection terminal 22B and the input terminal 22C; the first external connection terminal 25 capable of being connected to an external ground, the first external connection terminal 25 being connected to the control-side ground line CL as a conduction path connected to the ground connection terminal 22B; the second external connection terminal 26 capable of being connected to an external ground, the second external connection terminal 26 being connected to the power-side ground line PL as a conduction path having a greater electrifying current than the control-side ground line CL; and the transistor 28 that restricts the electric power direction of the first bypass line BL1 connected between the control-side ground line CL and the power-side ground line PL to one direction, and that outputs the sensing signal corresponding to the electric power flowing through the first bypass line BL1 to the input terminal 22C.

When the first external connection terminal 25 or the second external connection terminal 26 is not connected to the external ground due to a disconnection, an inter-terminal connection problem, or the like, the control-side ground line CL or the power-side ground line PL is open to a ground GND. According to the present embodiment, the electric power direction of electric power flowing in the first bypass line BL1 connecting the control-side ground line CL to the power-side ground line PL is restricted to one direction. As such, grounding can be achieved by using another ground line different from the ground line that is in an open state. Additionally, when electric power flows in the first bypass line BL1, the sensing signal based on the electric power is output to the input terminal 22C of the control unit 21 from the transistor 28. Accordingly, the control unit 21 can sense a disconnection or the like on the basis of the sensing signal input from the input terminal 22C. This makes it possible to sense a disconnection without switching among circuits or the like, for example, which in turn makes it possible to simplify the circuit configuration. Additionally, the number of components can be reduced as compared to a configuration in which electric power is sent in two directions by using two parallel diodes 29 between the control-side ground line CL and the power-side ground line PL.

Additionally, the control-side ground line CL and the power-side ground line PL are connected by the second bypass line BL2, which is provided parallel with the first bypass line BL1. The diode 29 that sends electric power in the same direction as the electric power direction of the first bypass line BL1 but restricts electric power in the opposite direction is connected to the second bypass line BL2 between the control-side ground line CL and the power-side ground line PL.

This electrifies not only the transistor 28 in the first bypass line BL1, but also the diode 29 in the second bypass line BL2, which makes it possible to increase the electric power sent between the control-side ground line CL and the power-side ground line PL as compared to a configuration that does not include the second bypass line BL2.

Additionally, the transistor 28 permits electric power in the direction from the control-side ground line CL toward the power-side ground line PL, and restricts electric power in the opposite direction.

Compared to the power-side ground line PL, it is difficult to sense disconnections in the path connected to the control-side ground line CL. However, according to the present embodiment, disconnections can be sensed in the path connected to the control-side ground line CL, where it is difficult to sense such disconnections.

Additionally, the conduction path including the power-side ground line PL generally has a higher permissible current value than the conduction path including the control-side ground line CL. Thus by allowing electrification in the direction from the control-side ground line CL toward the power-side ground line PL and restricting electrification in the opposite direction, problems caused by the electrifying current exceeding the capacitance value of the conduction path can be suppressed.

Other Embodiments

The technique disclosed in the present specification is not limited to the embodiment described above with reference to the drawings. For example, embodiments such as the following also fall within the technical scope of the technique disclosed in the present specification.

In the above embodiment, the disconnection sensing circuit 20 is provided with the second bypass line BL2. However, the configuration may be such that the second bypass line BL2 is not provided.

Although the transistor 28 is described as an NPN junction bipolar transistor 28, the transistor 28 is not limited thereto. For example, a PNP junction bipolar transistor, a FET (field effect transistor), or the like may be used as the transistor.

The first bypass line BL1 is configured so as to electrify from the control-side ground line CL to the power-side ground line PL. However, the first bypass line BL1 may be configured to electrify from the power-side ground line PL toward the control-side ground line CL. Likewise, the second bypass line BL2 may be configured to electrify from the power-side ground line PL toward the control-side ground line CL.

The invention claimed is:

1. A disconnection sensing circuit comprising:
a control unit having a ground connection terminal and an input terminal;
a first external connection terminal capable of being connected to an external ground, the first external connection terminal being connected to a control-side ground line as a conduction path connected to the ground connection terminal;
a second external connection terminal capable of being connected to an external ground, the second external connection terminal being connected to a power-side ground line as a conduction path having a greater electrifying current than the control-side ground line; and
a transistor having a collector, a base and an emitter, the emitter coupled to a first bypass line, the input terminal connected to the collector and the base being connected to the control-side ground line, wherein the transistor restricts an electric power direction of the first bypass line connected between the control-side ground line and the power-side ground line to one direction, and that outputs a sensing signal corresponding to electric power flowing through the first bypass line to the input terminal.

2. The disconnection sensing circuit according to claim 1,
wherein the control-side ground line and the power-side ground line are connected by a second bypass line provided parallel with the first bypass line; and
a diode that sends electric power in the same direction as the electric power direction of the first bypass line but restricts electric power in the opposite direction is connected to the second bypass line between the control-side ground line and the power-side ground line.

3. The disconnection sensing circuit according to claim 1, wherein the transistor permits electric power in a direction from the control-side ground line toward the power-side ground line, and restricts electric power in the opposite direction.

4. An electrical connection box comprising:
the disconnection sensing circuit according to claim 1; and
a case housing the disconnection sensing circuit.

5. The disconnection sensing circuit according to claim 2, wherein the transistor permits electric power in a direction from the control-side ground line toward the power-side ground line, and restricts electric power in the opposite direction.

6. An electrical connection box comprising:
the disconnection sensing circuit according to claim 2; and
a case housing the disconnection sensing circuit.

7. An electrical connection box comprising:
the disconnection sensing circuit according to claim 3; and
a case housing the disconnection sensing circuit.

* * * * *